(12) United States Patent
Yang et al.

(10) Patent No.: US 6,905,938 B2
(45) Date of Patent: Jun. 14, 2005

(54) METHOD OF FORMING INTERCONNECT STRUCTURE WITH LOW DIELECTRIC CONSTANT

(75) Inventors: Ming-Sheng Yang, Hsin-Chu (TW); Chih-Chien Liu, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 47 days.

(21) Appl. No.: 10/315,128

(22) Filed: Dec. 10, 2002

(65) Prior Publication Data

US 2003/0119306 A1 Jun. 26, 2003

Related U.S. Application Data

(63) Continuation-in-part of application No. 09/840,715, filed on Apr. 24, 2001, now abandoned.

(51) Int. Cl.[7] .............................................. H01L 21/76
(52) U.S. Cl. ........................ 438/422; 438/421; 438/700; 438/701; 438/734
(58) Field of Search ................................. 257/506, 522; 438/421, 422, 734, 700, 701

(56) References Cited

U.S. PATENT DOCUMENTS

| | | | | | |
|---|---|---|---|---|---|
| 5,641,712 | A | * | 6/1997 | Grivna et al. | 438/624 |
| 5,792,706 | A | * | 8/1998 | Michael et al. | 438/626 |
| 6,208,015 | B1 | * | 3/2001 | Bandyopadhyay et al. | 257/635 |
| 6,451,669 | B2 | * | 9/2002 | Torres et al. | 438/409 |
| 6,583,489 | B2 | * | 6/2003 | Wang et al. | 257/520 |
| 6,657,305 | B1 | * | 12/2003 | Cohen et al. | 257/773 |

* cited by examiner

Primary Examiner—Christian Wilson
(74) Attorney, Agent, or Firm—Dickinson Wright PLLC

(57) ABSTRACT

The present invention provides a method for forming low dielectric constant inter-metal dielectric layer. The method includes providing a semiconductor substrate and forming a first dielectric layer on the semiconductor substrate. Conductor structures are formed in the first dielectric layer. The partial first dielectric layer is removed by using the conductor structures as etching mask. A second dielectric layer is formed between the conductor structures, which has a dielectric constant smaller than the first dielectric layer. The second dielectric layer also alternatively has air voids contained therein to reduce dielectric constant.

17 Claims, 3 Drawing Sheets

METHOD OF FORMING INTERCONNECT STRUCTURE WITH LOW DIELECTRIC CONSTANT

This application is a continuation-in-part of original U.S. patent application Ser. No. 09/840,715 filed on Apr. 24, 2001 now abandoned.

BACKGROUND OF THE INVENTION

1. Field of the Invention

The invention relates to a method for forming interconnect structures, and more particularly to a method for forming interconnect structures with a low dielectric constant.

2. Description of the Prior Art

It is the nature of semiconductor physics that as the feature sizes are scaled down, the performance of internal devices in integrated circuits improves in a compounded fashion. That is, the device speed as well as the functional capability improves. The overall circuit speed, however, becomes more dependent upon the propagation speed of the signals along interconnects that connect the various devices together. With the advent of very and ultra large scale integration (VLSI and ULSI) circuits, it has therefore become even more important that the metal conductors that form the interconnections between devices as well as between circuits in a semiconductor have low resistivity for high signal propagation. Copper is often preferred for its low resistivity, as well as for resistance to electro-migration and stress voiding properties.

On the other hand, considerable attention has focused on the replacement of silicon dioxide with new materials, particular material having lower dielectric constants, since both capacity delays and power consumption depend on the dielectric constant of insulator. Accordingly, circuit performance enhancement has been sought by combining copper conductors with low dielectric constant insulators (k less than approximately 4).

More recently, in order to further improve device performance, researchers have sought to apply dielectric materials with lower dielectric constant than the conventional CVD deposited silicate glasses such as silicon oxide, PSG (phosphosilicate glass) and BPSG (borophosphosilicate glass). Various organic insulator such as parylene, fluorinated polyimides and arylene ether polymers, have been successfully used as low dielectric constant (low-k) replacements for silicon oxide. Porous silica based materials such as siloxanes, silsequioxanes, aerogels, and xerogels have also been implemented as ILD (inter layer dielectric) and IMD (inter-metal dielectric) layers.

However, the spin on dielectric (SOD) materials, like the SOGs and polyimides are extremely sensitive to the methods and conditions by which they are dried and cured after application. Not only are the resultant electrical characteristics of the dielectric layer affected by the drying and curing regimen, but also the physical properties including stress, mechanical strength and physical and chemical durability are affected as well. As shown in FIG. 1, interconnect system is manufactured on conventional low-k IMD system using conventional dual damascene process. The soft SOD layer 112 on a semiconductor structure 110, is adjacent to multitude of conductor contacts 114 and interconnect 115, which is porous dielectric and has weak mechanical strength. However, there are some problems, such as via deformation and structure distortion, happening due to the softness characteristic of the low-k SOD layer.

SUMMARY OF THE INVENTION

It is one object of the present invention to provide a method for forming a semiconductor structure with low dielectric constant inter-metal dielectric. The inter-metal dielectric of the semiconductor structure has low dielectric constant material filled in multitude of interconnect structures between multitudes of metal structures.

It is another object of the present invention to provide a method for forming an interconnect structure. The interconnect structure can be with characteristics of low dielectric constant and enhanced mechanical strength.

It is yet other object of the present invention to provide a method for forming an inter-metal dielectric layer of a semiconductor structure. The inter-metal dielectric layer simultaneously has low-k and oxide-based materials to prevent metal structures from deformation and distortion.

In the present invention, a method is for forming low dielectric constant inter-metal dielectric layer. The method includes providing a semiconductor structure and forming a first dielectric layer on the semiconductor structure. Conductor structures are formed in the first dielectric layer. The partial first dielectric layer is removed by using the conductor structures as etching mask. A second dielectric layer is formed between the conductor structures, which has a dielectric constant smaller than the first dielectric layer. The second dielectric layer also alternatively has air voids contained therein.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

The semiconductor devices of the present invention are applicable to a board range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a method is for forming low dielectric constant inter-metal dielectric layer. The method includes providing a semiconductor structure and forming a first dielectric layer on the semiconductor structure. Conductor structures are formed in the first dielectric layer. The partial first dielectric layer is removed by using the conductor structures as etching mask. A second dielectric layer is formed between the conductor structures, which has a dielectric constant smaller than the first dielectric layer.

Figure 1:
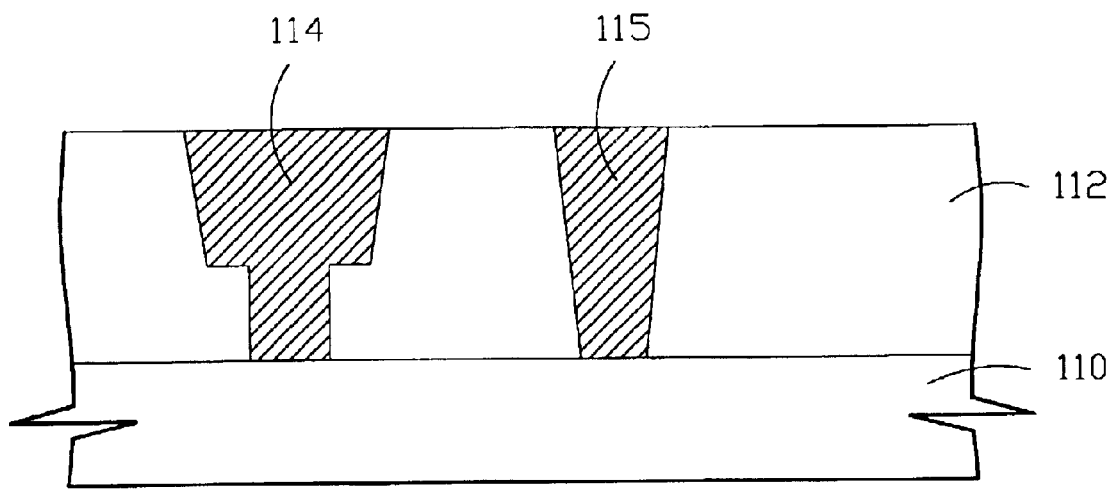
FIG. 1 is a cross-sectional schematic diagram illustrating a low-k IMD system manufactured by using dual damascene process in accordance with the prior art.
Figure 2A:
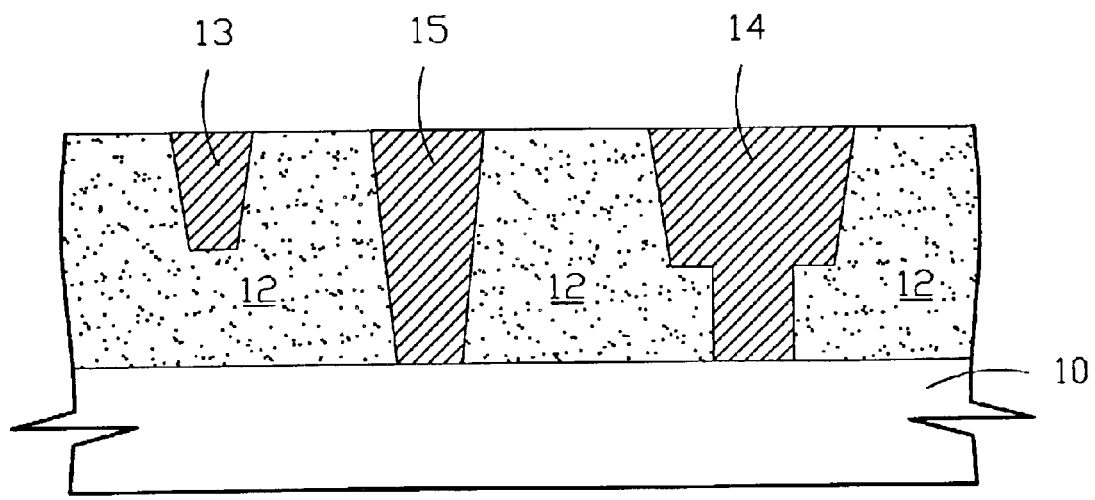
FIGS. 2A–2C are a series of cross-sectional schematic diagrams illustrating IMD system manufactured in accordance with the present invention.
Figure 2B:
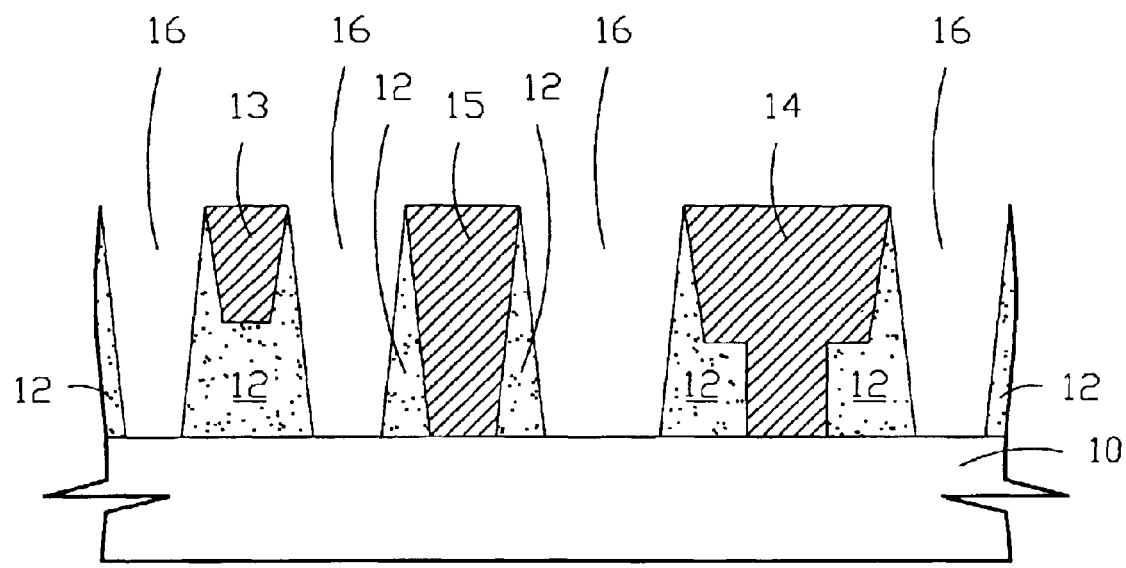
Figure 2C:
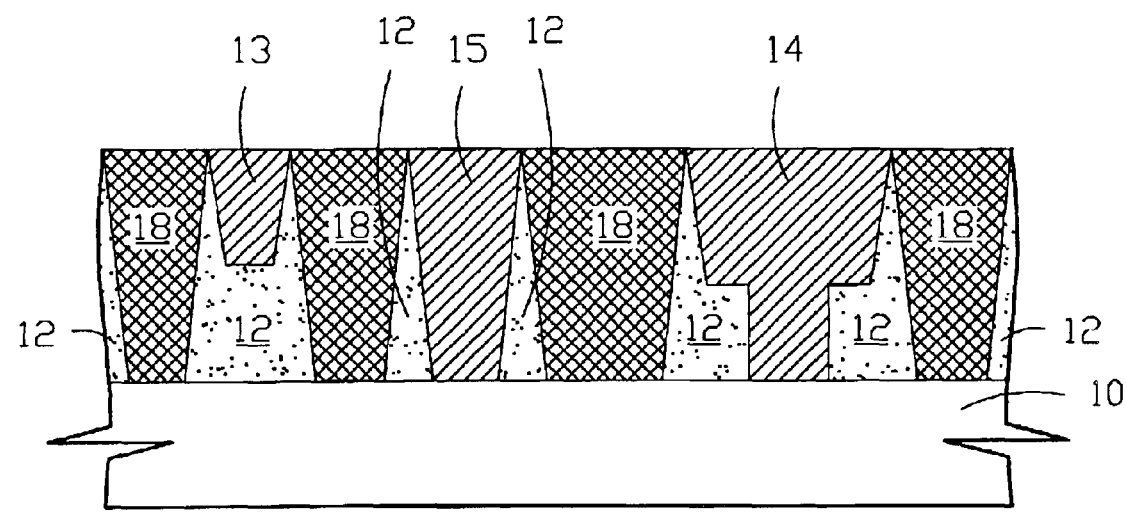

One embodiment of the present invention is depicted in FIGS. 2A–2C, which show a series of cross-sections of an interconnect portion of a semiconductor wafer to form by using the dual damascene process. Multitude of conductor structures, such as contact 13, wiring line 14 and interconnect structure 15, are formed in an oxide-based IMD layer 12 on a semiconductor structure 10. In the embodiment, the semiconductor structure 10 includes a silicon substrate and other devices on the silicon substrate. The contacts 13, wiring line 14 and interconnect structure 15 are filled with conductor metal material, such as copper. In the present invention, the conductor structures including the contact 13, wiring line 14, and the interconnect structure 15 are formed by conventional wiring or damascene technologies. The oxide-based IMD layer 12 can be undoped silicate glass (USG) films deposited by chemical vapor deposition processing, but may also be a number of other types of films, including fluorosilicate glass (FSG), phosphorous-doped silicate glass (PSG), boron nitride (BN) and amorphous carbon), as well as to films deposited by other deposition techniques. Those materials of oxide-based IMD can provide better mechanical strength for the conductor structures.

Next, as one key step of the present invention shown in FIG. 2B, the oxide-based IMD layer 12 is partially etched away using those conductor structures, such as the contacts 13, wiring line 14 and interconnect structure 15, as self-aligned hard mask. Then some openings 16 between the conductor structures are formed after removing parts of the oxide-based IMD layer 12. To be specific, some parts of the oxide-based IMD layer 12 can be remained on the semiconductor structure 10, such as at sidewall of the contact 13. In other words, the oxide-based IMD layer 12 is remained on the lateral sides of contact 13, wiring line 14, and interconnect structure 15. Those residual oxide-based IMD layer 12 can enhance the mechanical strength that may prevent those conductor structures from deformation or distortion.

As depicted in FIG. 2C, those openings 16 between the conductor structures are filled with low-k IMD material, such as spin-on dielectric material, to form multitude of spin-on dielectric structures 18. These spin-on dielectric structures 18 are partially adjacent to both the conductor structures and residual oxide-based IMD. In the present invention, the low-k IMD material in the openings 16 between the conductor structures can provide the characteristic of low-k for the semiconductor device, and simultaneously, the remained oxide-based IMD adjacent to the openings 16 can provide the enhanced mechanical strength for the semiconductor device. Compared with those conventional semiconductor devices having total low-k IMD around the conductor structures, the semiconductor device of the present invention can have better performances in intra-metal capacitance and less impact on RC delay because of its enhanced mechanical strength around the conductor structures and low-k IMD.

Figure 3A:
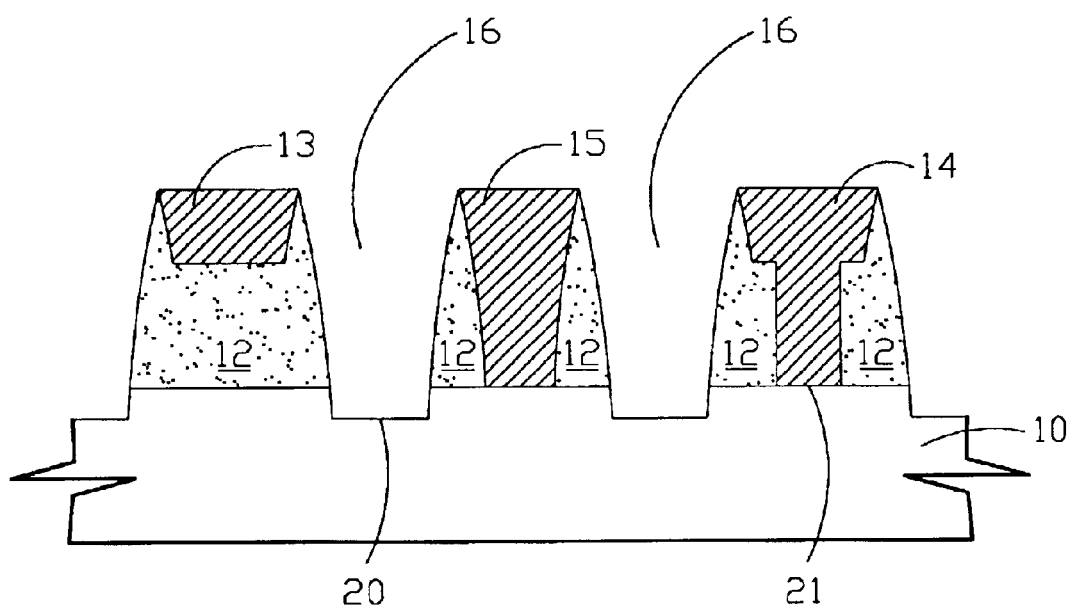
FIGS. 3A–3B are schematically cross-sectional diagrams illustrating another embodiment in accordance with the present invention.
Figure 3B:
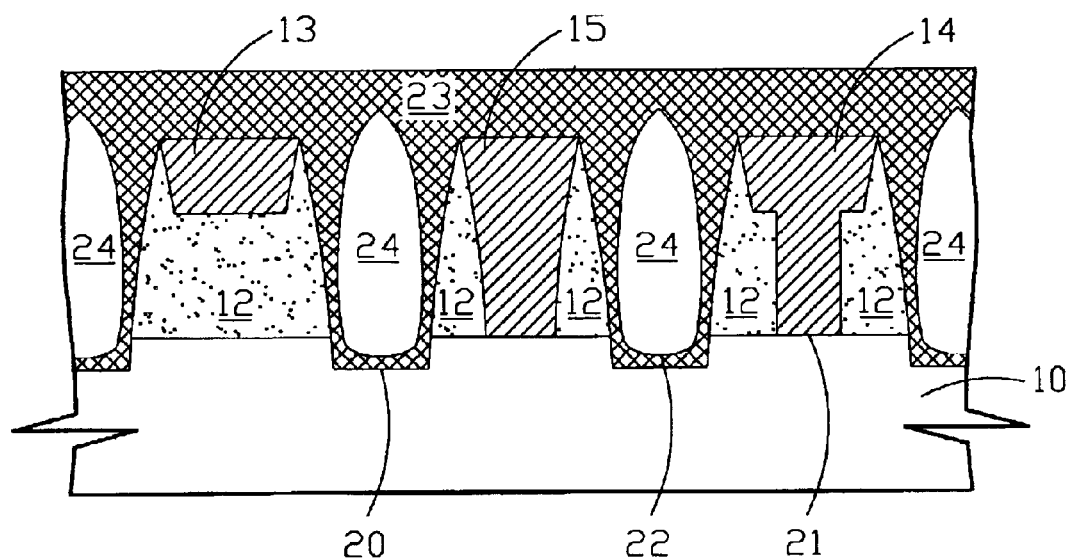

FIGS. 3A–3B are schematically cross-sectional diagrams illustrating another embodiment in accordance with the present invention. In the present invention, alternatively, the spin-on dielectric structures 18 shown above are replaced. Shown in FIG. 3A, during removal of portions of the oxide-based IMD layer 12, the semiconductor structure 10 below the removed oxide-based IMD layer 12 is also removed. Thus, compared the lowest bottom 21 of the wiring line 14, the bottom 20 of the opening 16 has a lower level than the wiring line 14.

Depicted as FIG. 3B, a dielectric layer 23 is formed over the semiconductor structure 10, contacts 13, wiring line 14, interconnect structure 15. To be specific, in this embodiment, the formation of the dielectric layer 23 includes the formation of air voids 24 therein. The dielectric layer 23 could be made of oxide-based material, such as doped or undoped silicate glass (USG) layer. The doped silicate glass layer includes PSG(phosphorous-doped silicate glass), FSG(fluorine doped silicon dioxide glass), BPSG (boron and phosphorous-doped silicate glass), or SRO (SrRuO$_x$). Furthermore, the dielectric layer 23 is formed by general methods of chemical vapor deposition, such as APCVD(atmospheric CVD), PECVD(plasma-enhanced CVD), SACVD (sub-atmospheric pressure thermal CVD), or HDPCVD(high-density plasma CVD).

To be specific, in a preferred embodiment, the air void 24 has a lower bottom 22 than the lowest bottom 21 of the wiring line 14. That is, the air voids 24 have a portion extruded into the semiconductor structure 10. Furthermore, top portions of air voids 24 are protuberated out the contact 13, wiring line 14, or interconnect structure 15.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming low dielectric constant inter-metal dielectric layer, said method comprising;

providing a semiconductor substrate;

forming a first dielectric layer on said semiconductor substrate; forming a plurality of conductor structures in said first dielectric layer;

partially removing said first dielectric layer, said removing step using said conductor structures as etch mask; and forming a second dielectric layer between said conductor structure, said second dielectric layer having a dielectric constant smaller than said first dielectric layer having.

2. The method according to claim 1, wherein said first dielectric layer can be made of oxide-based material.

3. The method according to claim 1, wherein said first dielectric layer can be made of spin-on dielectric material.

4. The method according to claim 1, wherein said forming second dielectric layer comprises forming an air void during said method.

5. A method for improving mechanical strength of a low dielectric constant inter-metal dielectric layer, said method comprising:

providing a semiconductor structure;

forming an oxide-based inter-metal dielectric layer on said semiconductor structure;

forming a plurality of metal structures in said oxide-based inter-metal dielectric layer;

removing partial said oxide-based inter-metal dielectric layer, said removing step using said metal structures as an etch mask, wherein said etching mask is a self-aligned hard mask; and spinning a dielectric layer between said metal structures, said dielectric layer having a dielectric constant smaller than said oxide-based inter-metal dielectric layer.

6. The method according claim 5, wherein said oxide-based inter-metal dielectric layer comprises an undoped silicate glass layer.

7. A method for forming low dielectric constant inter-metal dielectric layer, said method comprising:

providing a semiconductor structure;

forming a first dielectric layer on said semiconductor structure;

forming a plurality of conductor structures in said first dielectric layer;

removing partial said oxide-based inter-metal dielectric layer, said removing step using said metal structures as an etch mask, wherein said etching mask is a self-aligned hard mask; and forming a second dielectric layer between said conductor structures, said second dielectric layer having a dielectric constant smaller than said first dielectric layer and having at least an air void contained therein.

8. The method according to claim 7, wherein said step of forming said second dielectric layer comprises forming an oxide-based layer.

9. The method according to claim 7, wherein said step of forming said second dielectric layer comprises forming a said second dielectric layer selected from the group of USG (undoped silicate glass) layer BPSG (boron and phosphorous-doped silicate glass), FSG (fluorine doped silicon dioxide (SiO.sub2) glass), PSG (phosphorous-doped silicate glass), and SRO (silicon rich oxide) layer.

10. The method according to claim 7, wherein said step of removing partial said first dielectric layer further comprises removing a portion of said semiconductor structure below said removed first dielectric layer.

11. The method according to claim 10, wherein said air void is formed to have a portion extruded into said semiconductor structure.

12. The method according to claim 7, wherein said step of forming said second dielectric layer further comprises forming said second dielectric layer over said semiconductor structure.

13. The method according to claim 12, wherein said air void is formed to have a portion protuberated out said semiconductor structure.

14. The method according to claim 7, wherein said step of forming said second dielectric layer is implemented by a method of chemical vapor deposition.

15. The method according to claim 14, wherein said method of chemical vapor deposition is selected from the groups of APCVD, PECVD, SACVD, and HDPCVD.

16. A method for forming low dielectric constant inter-metal dielectric layer, said method comprising:

providing a semiconductor structure, said semiconductor structure having a plurality of conductor structures thereon and a first dielectric layer on lateral sides of said conductor structures by partially removing said first dielectric layer in self-aligned etching method with said conductor structures as etching masks, and forming a second dielectric layer over said conductor structures, said second dielectric layer having at least an air void contained therein and a smaller dielectric constant than said first dielectric layer.

17. The method according to claim 16, wherein said second dielectric layer comprises a doped or undoped silicate glass layer.

* * * * *